United States Patent
Sturm et al.

(10) Patent No.: US 6,566,156 B1
(45) Date of Patent: May 20, 2003

(54) PATTERNING OF THIN FILMS FOR THE FABRICATION OF ORGANIC MULTI-COLOR DISPLAYS

(75) Inventors: James C. Sturm, Skillman, NJ (US); Chung-Chih Wu, Shin Hai Road (TW)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/202,150

(22) PCT Filed: Jun. 12, 1997

(86) PCT No.: PCT/US97/10289

§ 371 (c)(1),
(2), (4) Date: Jun. 14, 1999

(87) PCT Pub. No.: WO97/48139

PCT Pub. Date: Dec. 18, 1997

Related U.S. Application Data (60) Provisional application No. 60/019,656, filed on Jun. 12, 1996.

(51) Int. Cl.$^7$ .................................................. H01L 21/00
(52) U.S. Cl. ............................ 438/35; 438/38; 438/82; 438/99; 257/40; 257/103
(58) Field of Search .............................. 438/35, 37, 38, 438/39, 40, 92, 99; 257/40, 642, 103

(56) References Cited

U.S. PATENT DOCUMENTS

| | | | | |
|---|---|---|---|---|
| 5,276,380 A | | 1/1994 | Tang | |
| 5,343,050 A | * | 8/1994 | Egusa et al. | 257/40 |
| 5,629,530 A | * | 5/1997 | Brown et al. | 257/40 |
| 5,641,611 A | * | 6/1997 | Shieh et al. | 438/35 |
| 5,672,938 A | | 9/1997 | Jones | |

* cited by examiner

Primary Examiner—Kevin M. Picardat
(74) Attorney, Agent, or Firm—Kenyon & Kenyon

(57) ABSTRACT

Organic light emitting devices and methods of making them are described. The devices contain a substrate, a first electrical contact layer, a patterned organic layer, and a second electrical contact layer. A covering portion covers the sides of the organic layer, protecting the same. In the methods, a first organic layer is provided over a first electrical contact layer, followed by a patterned second electrical contact layer. The organic layer is etched using the patterned electrical contact layer as a mask. In one embodiment, the etching step exposes an area over the first electrical contact layer, and a second organic layer is provided over the exposed area.

28 Claims, 8 Drawing Sheets

PATTERNING OF THIN FILMS FOR THE FABRICATION OF ORGANIC MULTI-COLOR DISPLAYS

CROSS-REFERENCE TO RELATED APPLICATIONS

This application claims the benefit of U.S. Provisional Application No. 60/019,656, filed Jun. 12, 1996.

FIELD OF THE INVENTION

The present invention is directed to the integration of organic light emitting devices of different colors onto a common substrate.

BACKGROUND OF THE INVENTION

Organic light emitting devices (OLEDs) are light emitting devices that are comprised of several layers, in which one of the layers is comprised of an organic material that can be made to electroluminesce by applying a voltage across the device. A long sought goal in the display field has been the integration of light emitting devices (LEDs) of three different colors onto a single substrate. While OLEDs have shown versatility in terms of colors and freedom of substrates in recent years, integration of OLEDs of different colors has proven difficult because of difficulties associated with the processing and patterning of the organic materials. Therefore, multicolor work to date in the field has been based on integrating red, green and blue filters over a single type of white emitting device, integrating red and green down-conversion phosphors with a single type of blue emitting device, or adjusting the emission of a single type of broadband organic emitter by using three different kinds of microcavities.

A clearly desirable alternative would be to fabricate three different devices with three different organic layers, each optimized for a different color and integrated onto a common substrate. However, there are difficulties associated with the integration of red, green and blue devices for the subpixels of a full-color display. For example, the microfabrication of small pixels in high resolution displays will involve the patterning of films and microprocessing, which inevitably require the use of solvents, acid and water. The direct exposure of organic materials to solvents, acid and water can lead to the degradation or even the complete failure of devices. For instance, the solvent carrying polymers during later spin-coating of another layer might redissolve the polymer thin films in existing devices. Therefore, a need exists to integrate multiple organic LEDs on a single substrate with each LED representing a different color without degrading the devices.

SUMMARY OF THE INVENTION

The present invention is directed to OLED device structures and methods that allow for multiple colors to be integrated onto a single substrate.

An advantage of the present invention is that OLEDs for multiple colors can be integrated on a single substrate without substantial device degradation.

Several embodiments of the invention are directed to an organic light emitting device. The device comprises: a substrate, a first electrical contact layer over the substrate, a patterned organic layer over the first contact layer, a second electrical contact layer over the organic layer, and a covering portion covering the sides of the organic layer. The first electrical contact layer can be patterned.

In a first related embodiment, the covering portion includes an insulating sidewall extending from the first electrical contact layer to the second electrical contact layer.

In a second related embodiment, the first electrical contact layer is patterned, the organic layer covers sides of the first electrical contact layer, and the covering portion includes a conductive layer extending at least from the substrate to the second electrical contact layer.

In third and fourth related embodiments, the device further comprises an insulating layer with an aperture formed therein over the first electrical contact layer. The organic layer extends over and into the aperture and a over portion of the insulating layer adjacent the aperture. In the third related embodiment, the covering portion includes a conductive layer extending from the insulating layer and covering the second electrical contact layer. In the fourth related embodiment, the covering portion includes a conductive or insulating sidewall extending from the insulating layer to the second electrical contact layer.

In the above embodiments, the following materials are among those preferred: A preferred substrate material for the practice of the present invention is glass. Preferred insulating layer materials and insulating covering portions (including sidewall spacers and covering layers) include silicon dioxide, silicon nitride, silicon oxynitride, and various insoluble organic materials. Preferred conducting covering portions include aluminum. Depending on the application, the first electrical contact can be the anode or the cathode, with the second electrical contact being the converse. Anode materials preferred for the practice of the present invention include platinum as well as indium-tin oxide or other transparent conducting oxide materials. A preferred cathode construction for the practice of the present invention is an Mg:Ag alloy overcoated with Ag. A preferred organic layer is a molecularly doped polymer such as a hole-transporting matrix polymer doped with one or more electron transporting molecules and one or more dyes. Preferred hole-transporting matrix polymers include PVK (poly[N-vinylcarbazole]). Preferred electron transporting molecules include tris(8-hydroxy quinolate)aluminum (Alq) and 2-(4-biphenyl)-5-(4-tert-butyl-phenyl)-1,3,4-oxadiazole (PBD). Another preferred class of organic materials includes conjugated polymers, such as polyphenylene vinylene and its derivatives (including MEHPPV). Of course, a host of other materials/configurations will readily suggest themselves to those skilled in the art.

It is contemplated that the above devices may be incorporated into computers, televisions, billboards, signs, vehicles, printers, telecommunications devices, telephones, and copiers.

Other embodiments of the invention are directed to a method of forming an organic light emitting device. The method comprises providing a first electrical contact layer, providing a first organic layer or layers over the first electrical contact layer, providing a patterned second electrical contact layer over the first organic layer, and etching the first organic layer using the patterned second electrical contact layer as a mask. In an alternative embodiment, the first organic layer is etched using as a mask a layer on top of the patterned second electrical contact layer which has the same pattern as the patterned second electrical contact layer. The first electrical contact layer may be patterned before providing the first organic layer. The first organic layer is preferably provided by spin coating or vacuum deposition. The second electrical contact layer is preferably patterned using a shadow mask technique or a photoresist technique.

In one embodiment, the step of etching exposes an area over the first electrical contact layer. A second organic layer is preferably provided over the exposed area, followed by an additional conductive layer and an additional etch step.

Many additional embodiments will become apparent upon reading the present specification and claims.

DETAILED DESCRIPTION OF PREFERRED EMBODIMENTS

The present invention will now be described in detail for specific preferred embodiments of the invention, it being understood that these embodiments are intended only as illustrative examples and the invention is not to be limited thereto.

Several embodiments or schemes of the present invention for integrating multiple organic LEDs on a single substrate will now be described.

Figure 1A:
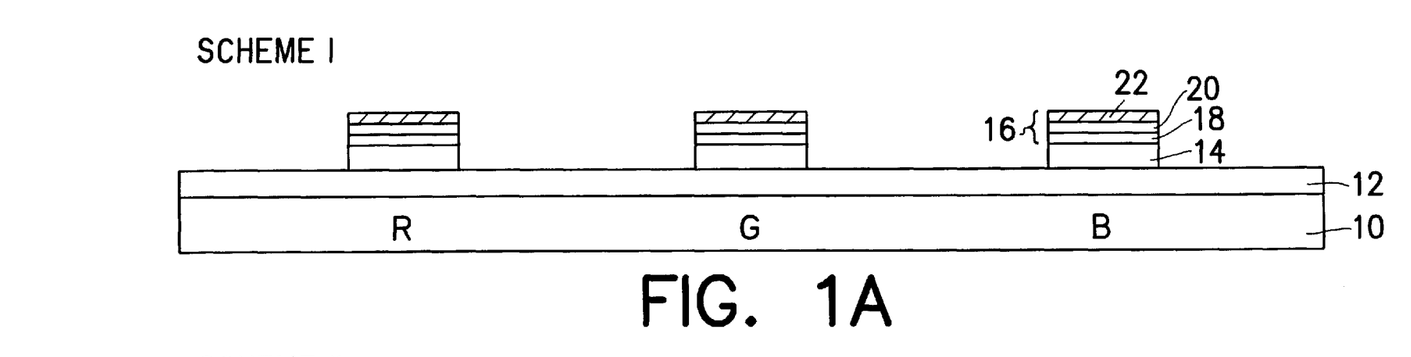
FIG. 1A illustrates a cross-sectional view of an integrated arrangement of three different light emitting devices on a common substrate according to an embodiment of the present invention referred to herein as scheme I.

FIG. 1A illustrates a cross-sectional view of an integrated arrangement of three different light emitting devices on a common substrate according to an embodiment of the present invention referred to herein as scheme I. Scheme I is the simplest and the most straightforward technique described herein for integrating three different devices R, G, and B onto a single substrate. Referring to FIG. 1A, the general structure of OLEDs includes a glass substrate 10. An indium-tin-oxide (ITO) contact 12 (or other transparent conductor) is deposited on substrate 10. Although not required, separate ITO contacts 12 can be patterned for each device. Preferably, the ITO is cleaned and treated before use. The cleaning and treatment of ITO is described in pending application entitled "Plasma Treatment of Conductive Layers," having Ser. No. PCT/US97/10252 (filed herewith), and incorporated herein by reference.

An organic layer 14 for the first device (R) is then provided on ITO contact 12. Organic layer 14 can include, for example, one or more polymer thin film(s). The polymer thin film(s) is (are) spin-coated on top of ITO contact 12 from solution. Alternatively, organic layer 14 may be deposited using vacuum deposition. A top contact 16, (which may be metal or other conducting material) is then deposited and patterned on organic layer 14 using a shadow mask or using photolithographic techniques. After the top contact 16 has been patterned, organic layer 14 is left exposed. The top layer 22 of top contact 16 (or the photoresist remaining on the surface of top layer 22 if photoresist was used) can be used as a mask to pattern organic layer 14. The extra organic layer unmasked by metal contacts can be removed by plasma dry etching, such as oxygen plasma, but not limited to oxygen plasma. Top contact 16 could be a single metal layer or a multi-layer metal stack (such as layers 18, 20 and 22). (Other conductive materials could also be used). In any case, the top layer 22 of the top metal contact 16 should use the metal which resists the plasma etching and would not react with the etching gas. As illustrated in FIG. 1A, the removal of the extra organic layer 14 leaves the sides of organic layer 14 unprotected. This technique is advantageous for the direct patterning of organic layer 14, because organic layer 14 is typically sensitive to processing liquids or gasses used in photolithographic processes.

The procedures from spin-coating to plasma etching are then repeated to fabricate the next set of device. As-a first step, an organic layer 14 for the second device (G) is provided on ITO contact 12. However, a problem arises, for example, when using polymers which share the same solvents, since the solvent carrying the second polymer tends to redissolve the first polymer through the unprotected sidewalls of the first set of devices. Irregular shorting, leakage, and degradation of existing devices following deposition of polymers are observed, though macroscopically the devices look the same. The schemes or embodiments of FIGS. 1B–1D, 2A and 2B of the present invention overcome this problem by using various techniques to protect the organic layer 14.

Figure 1B:
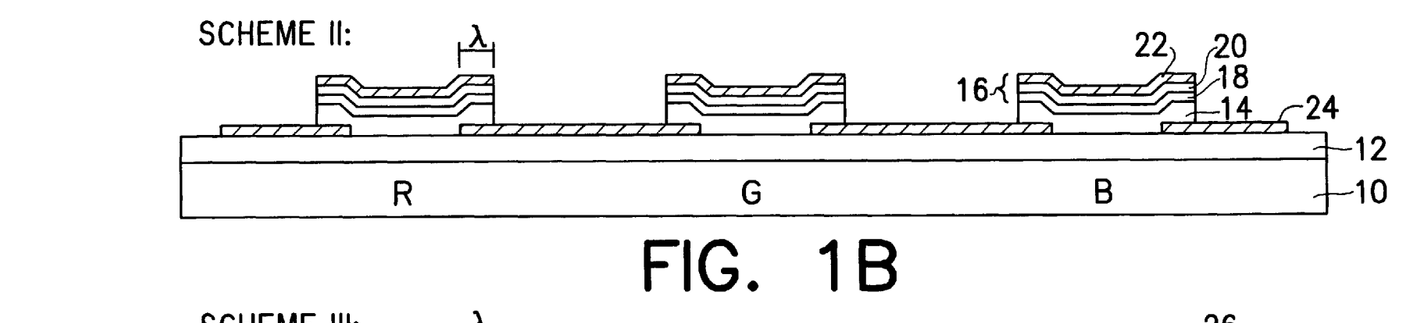
FIG. 1B illustrates a cross-sectional view of an integrated arrangement of three different light emitting devices on a common substrate according to an embodiment of the present invention referred to herein as scheme II.

FIG. 1B illustrates a cross-sectional view of an integrated arrangement of three different light emitting devices on a common substrate according to an embodiment referred to herein as scheme II. A thin insulating layer 24 is deposited on top of ITO contact 12 and patterned to create apertures or windows in the insulating layer 24. Organic layer 14 and top contacts 16 are provided over patterned insulating layer 24. Insulating layer 24 allows organic layer 14 and top contacts 16 to extend laterally beyond the window by some distance, λ. Because appreciable current flows only where there is a substantially vertical path from anode to cathode through the organic layer 14, portions of organic layer 14 extending substantially laterally beyond the windows are rendered inactive. As a result, the active device regions are defined by the opening windows or apertures in the insulating layer 24. This structure successfully keeps the active regions intact throughout subsequent polymer coatings and preserves the device characteristics. Scheme II avoids device degradation by providing an inactive region having a width corresponding to distance λ for organic layer 14 to absorb water, solvents, etc. This device works especially well in dry nitrogen atmosphere, but to prevent any possible attack of the organic materials by air, moisture, or processing liquids, protective coverings or sidewall spacers can be used as provided in the embodiments of FIGS. 1C, 2A and 2B of the present invention.

Figure 1C:
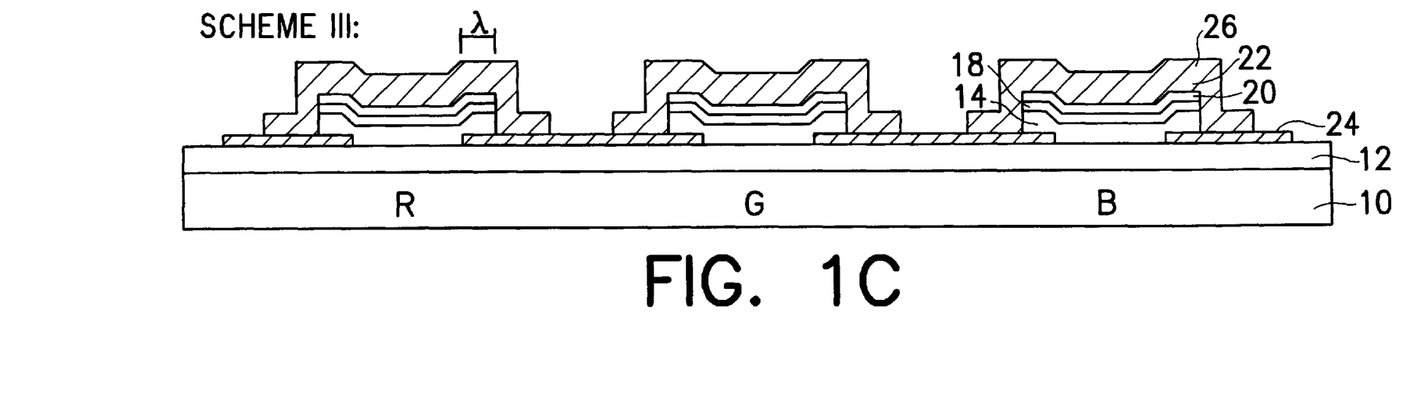
FIG. 1C illustrates a cross-sectional view of an integrated arrangement of three different light emitting devices on a common substrate according to an embodiment referred to herein as scheme III.

FIG. 1C illustrates a cross-sectional view of an integrated arrangement of three different light emitting devices on a common substrate according to an embodiment referred to herein as scheme III. In scheme III, existing devices can be protected from the attack of air, moisture or processing liquids by overcoating a whole device with a protective covering layer 26, which can be a thick layer of air-stable metal. Other insoluble materials may be used as protective covering layer 26. After the etching of the unmasked organic layer and before the coating of the next organic layer, the protective covering layer 26 (such as Al) is deposited to seal the whole device. Protective covering layer 26 extends from each insulating layer 24, up the sides of the organic layer 14 and over top contact 16. Since existing devices are now protected by the protective covering layer 26, λ, the distance from the edge of the active region to the edge of top contact 16, can be made as small as possible.

Figure 1D:
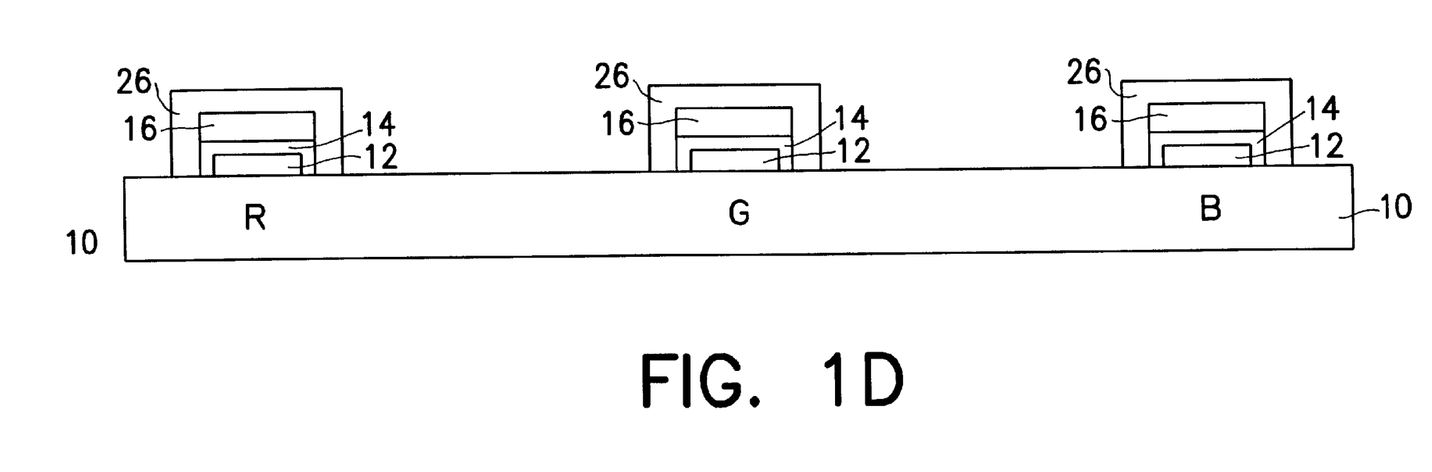
FIG. 1D illustrates a cross-sectional view of an integrated arrangement of three different light emitting devices on a common substrate according to an alternative embodiment of scheme III.

FIG. 1D illustrates a cross-sectional view of an integrated arrangement of three different light emitting devices on a common substrate according to an alternative embodiment of scheme III. In the embodiment of FIG. 1D, separate ITO contacts 12 are patterned for each device organic layer 14 is formed to completely cover both the top and the sides of ITO contact 12. Top contact 16 is provided over the organic layer 14. The protective covering layer 26 then covers the whole device as shown in FIG. 1D.

Figure 2A:
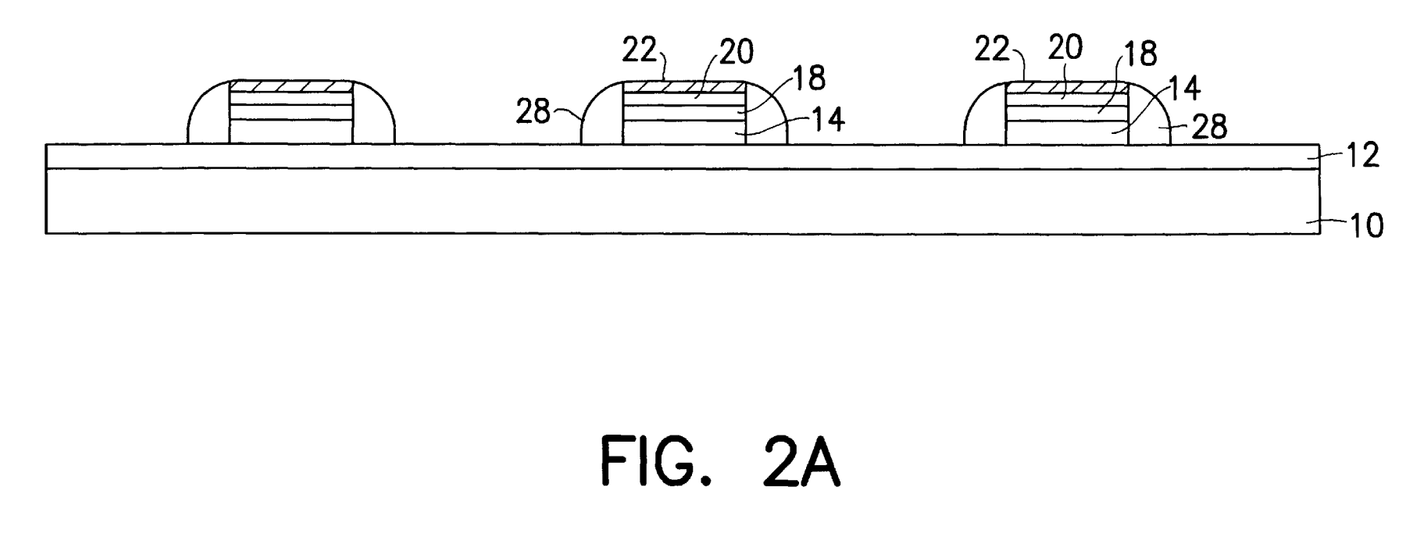
FIG. 2A illustrates a cross-sectional view of an integrated arrangement of three different light emitting devices on a common substrate according to an embodiment referred to herein as scheme IV.

FIG. 2A illustrates a cross-sectional view of an integrated arrangement of three different light emitting devices on a common substrate according to an embodiment referred to herein as scheme IV. In scheme IV, insulating sidewall spacers 28 are used to protect the edges of devices from water and solvents. The sidewall spacers 28 are preferably formed between the etching of the unmasked organic layer 14 and the coating of the next organic layer. As shown in FIG. 2A, with the use of sidewall spacers 28, the patterned insulating layer 24 on top of ITO contact 12 (FIGS. 1B and 1C) can be omitted. Due to the self-aligned nature of the etching of a conformal insulating layer, there is no extra lithography step required for the formation of sidewall spacers 28, compared to the formation of a sealing layer in scheme III.

Figure 2B:
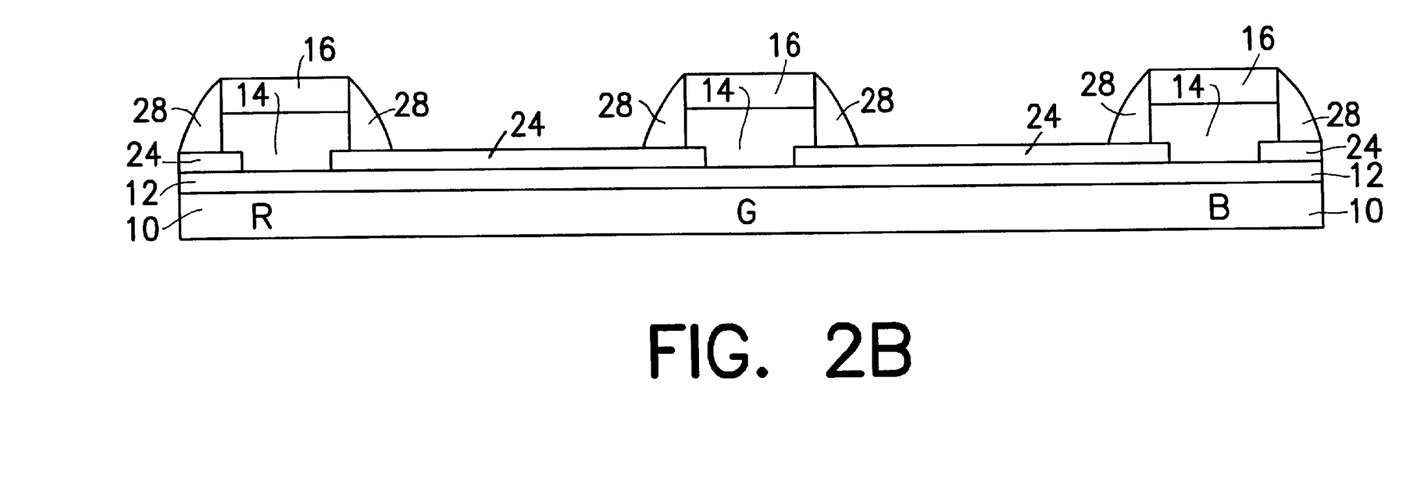
FIG. 2B illustrates a cross-sectional view of an integrated arrangement of three different light emitting devices on a common substrate according to an alternative embodiment of scheme IV.

FIG. 2B illustrates a cross-sectional view of an integrated arrangement of three different light emitting devices on a common substrate according to an alternative embodiment of scheme IV. Similar to the devices of FIG. 2A, the devices of FIG. 2B use sidewall spacers 28 to protect the edges of organic layer 14. The sidewall spacers 28 in FIG. 2B, however, are formed from metal or other conducting material. As a result, insulating layers 24 are provided between ITO contact 12 and sidewall spacers 28 to prevent a short-circuit between top contact 16 and ITO contact 12 via the sidewall spacer 28.

In the above embodiments, the following materials are among those preferred: A preferred substrate material for the practice of the present invention is glass. Preferred insulating layer materials and insulating covering portions (including sidewall spacers and covering layers) include silicon dioxide, silicon nitride, silicon oxynitride, and various insoluble organic materials. Preferred conducting covering portions include aluminum. Depending on the application, the first electrical contact can be the anode or the cathode, with the second electrical contact being the converse. Anode materials preferred for the practice of the present invention include platinum as well as indium-tin oxide or other transparent conducting oxide materials. A preferred cathode construction for the practice of the present invention is an Mg:Ag alloy overcoated with Ag. A preferred organic layer is a molecularly doped polymer such as a hole-transporting matrix polymer doped with one or more electron transporting molecules and one or more dyes. Preferred hole-transporting matrix polymers include PVK (poly[N-vinylcarbazole]). Preferred electron transporting molecules include tris(8-hydroxy quinolate) aluminum (Alq) and 2-(4-biphenyl)-5-(4-tert-butyl-phenyl)-1,3,4-oxadiazole (PBD). Another preferred class of organic materials includes conjugated polymers, such as polyphenylene vinylene and its derivatives (including MEHPPV). Of course, a host of other materials/configurations will readily suggest themselves to those skilled in the art.

Figure 3:
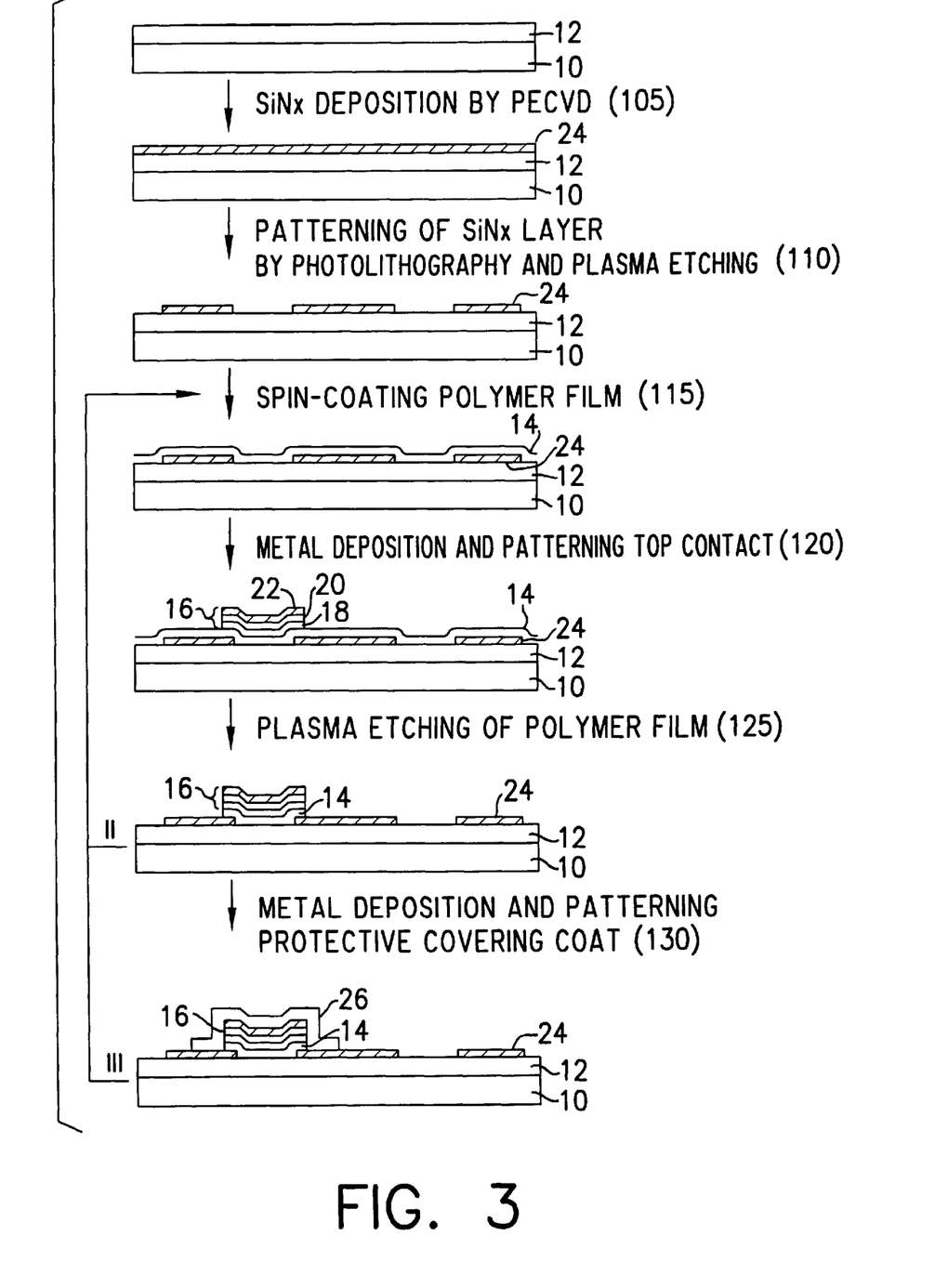
FIG. 3 is a flowchart illustrating the processing steps for producing the integrated devices of FIGS. 1B and 1C.

FIG. 3 is a flowchart illustrating the processing steps for producing the integrated devices of FIGS. 1B (scheme II) and 1C (scheme III) according to an embodiment of the present invention. At step 105, a thin layer of insulating silicon nitride $SiN_x$ or silicon oxide $SiO_x$ of approximately 100–5000 Angstroms (preferably 1000 Angstroms) is deposited on top of cleaned ITO contact 12 by plasma-enhanced chemical vapor deposition (PECVD) at 250–350° C. At step 110, the active device windows in the insulating layer 24 are then etched by plasma etching using $CF_4$ as the etching gas and photoresist as the mask. Patterns on the photoresist are formed by photolithography. After the removal of photoresist, the insulator-patterned ITO contact 12 is cleaned and treated using the above described and cited technique. At step 115, the polymer thin film (organic layer 14) for the first set of devices (orange in this case) is then spin-coated to cover the whole surface. Due to the unique way of coating polymer thin film 14 from solution and its macromolecular structure, the polymer thin film 14 formed on the patterned surface is expected to be rather conformal. After spin-coating, at step 120, the top metal contacts 16 for the first set of devices are evaporated through a shadow mask in vacuum at approximately $10^{-6}$ Torr. The top contact 16 can consist of only a single metal layer or a multilayer stack. In any case, the top layer is preferably air-stable (such as Aluminum) and resist against subsequent oxygen plasma etching. A three layer stack can be used for top contact 16 as shown in FIG. 3, including approximately 500 Angstrom coevaporated Mg:Ag alloy layer (layer 18) overcoated by approximately 500 Angstrom silver layer (layer 20) and overcoated by approximately 1000 Angstrom aluminum layer (layer 22).

At step 125, the structure is then exposed to an oxygen plasma, which etches away photoresist and organics where exposed, but does not etch top aluminum layer 22 of contact 16 or any layers underneath. Therefore, this plasma etching is self-aligned and does not need an extra mask. Also, the use of dry etching avoids the risk of excessive exposure of the organic films to solvents used in wet etching. After the oxygen plasma etching, the ITO surface is found to be clean enough for the next set of devices. There is no need for further wet cleaning by solvents, which is desired to avoid.

If scheme III (embodiment of FIG. 1C) is used, at step 130, the evaporation (deposition) of an air-stable metal seal (protective covering layer 26) is preferably carried out through an additional shadow mask before the coating of the polymer thin film for the next set of devices. Aluminum may be used as the air-stable metal. The steps from spin-coating of the polymer thin film (step 115) to the deposition of the aluminum seal 26 (step 130) are then repeated to integrate additional devices onto the common substrate (in this case, green and blue devices).

In this embodiment, except for the transfer of samples to the plasma etching system, all of the polymer processing and evaporator loading is preferably carried out in glove boxes filled with dry nitrogen. Moreover, the patterning of all metal layers is preferably done by mechanical alignment of shadow masks for metal deposition. However, the metal seal can also be formed by other techniques such as the blanket deposition of air-stable metal followed by photolithography and etching, since any existing devices and their polymer thin films are already sealed from the attack of any liquid. The patterning of top metal contacts may also be carried out by the deposition of continuous metal layers followed by photolithography and dry etching techniques, such as plasma etching with some suitable gases, sputter etching and ion milling.

Those skilled in the art will appreciate that similar processing steps may be performed to fabricate the devices of FIG. 1D, making the appropriate modifications. For example, ITO contacts 12 are separately patterned, and no insulating layer (layer 24) is provided in FIG. 1D. Also, the polymer film (organic layer 14) covers both the top and the sides of the ITO contact 12 in the device of FIG. 1D.

Figure 4:
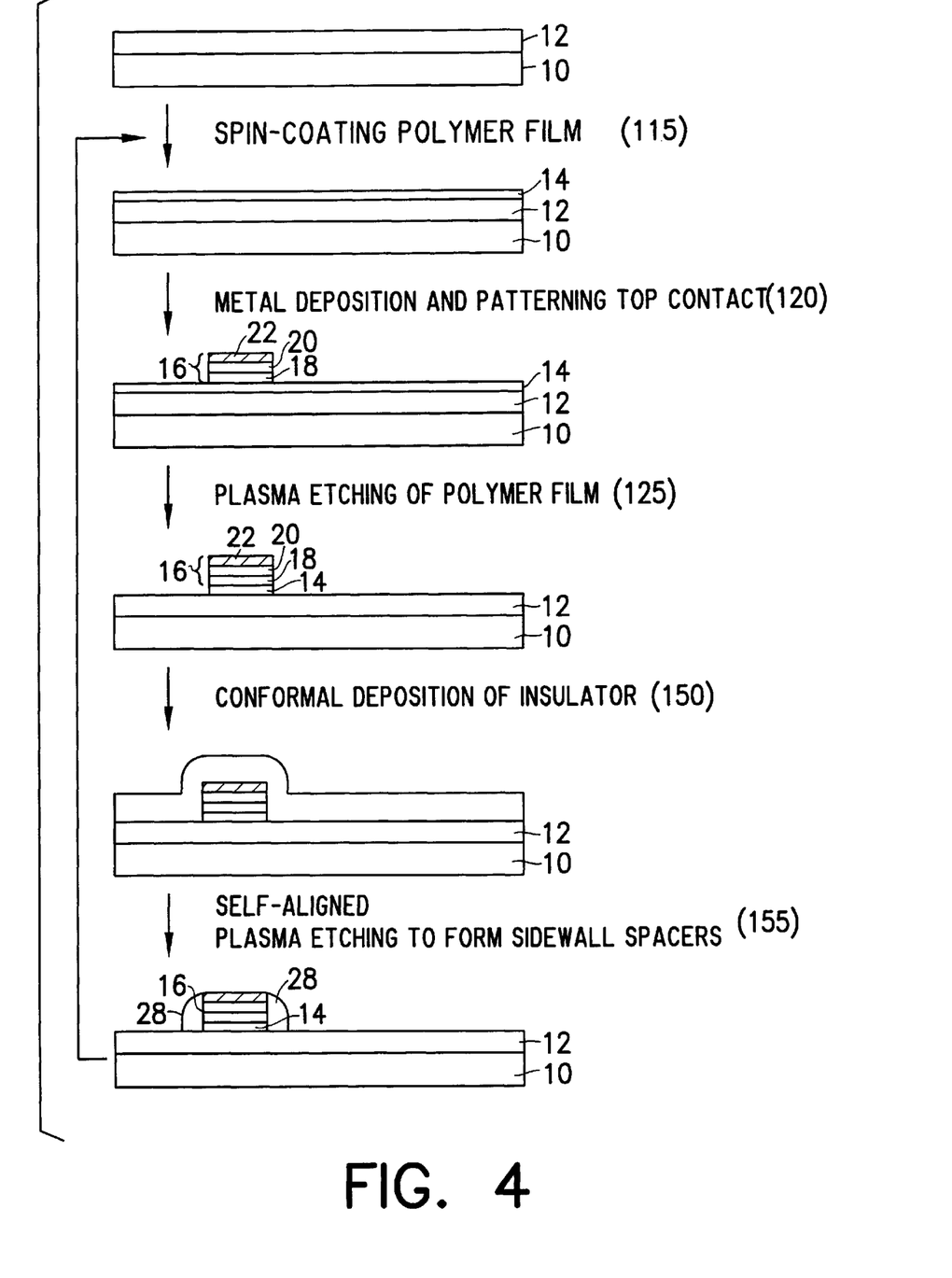
FIG. 4 is a flowchart illustrating the processing steps for producing the integrated devices of FIG. 2A.

FIG. 4 is a flowchart illustrating an embodiment for producing the integrated devices of FIG. 2A. If scheme IV is used, the processing of FIG. 3 is modified as shown in FIG. 4. In particular, the process of FIG. 4 does not include steps of deposition and patterning of SiN, layer 24 (steps 105, 110). After the plasma etching of the unmasked polymer thin film by using the metal contact as the self-aligned mask (step 125), a blanket insulating layer is deposited conformally at step 150. Then, at step 155, the insulating layer is etched back by plasma etching to form the sidewall spacers 28 around the edge of the existing devices. Also, to minimize the degradation of the polymer thin film by the formation of sidewall spacers, a low-temperature or room-temperature process is preferable for the deposition of the conformal insulating layer.

Those skilled in the art will appreciate that processing steps similar to FIG. 4 may be performed to fabricate the devices of FIG. 2B, making the appropriate modifications. For example, the device of FIG. 2B includes the additional step of depositing and patterning of SiN (insulating) layer 24 on ITO contact 12. Also, step 150 (for the device of FIG. 2B) includes the step of conformally depositing a blanket metal layer. The metal layer is plasma etched at step 155 to form metal sidewall spacers 28. In FIG. 2B, the insulating layers 24 prevent a short between top contact 16 and ITO contact 12 via the metal sidewall spacers 28.

Except for differences in techniques of organic deposition, all the above schemes or embodiments can be applied to molecular materials.

Figure 5:
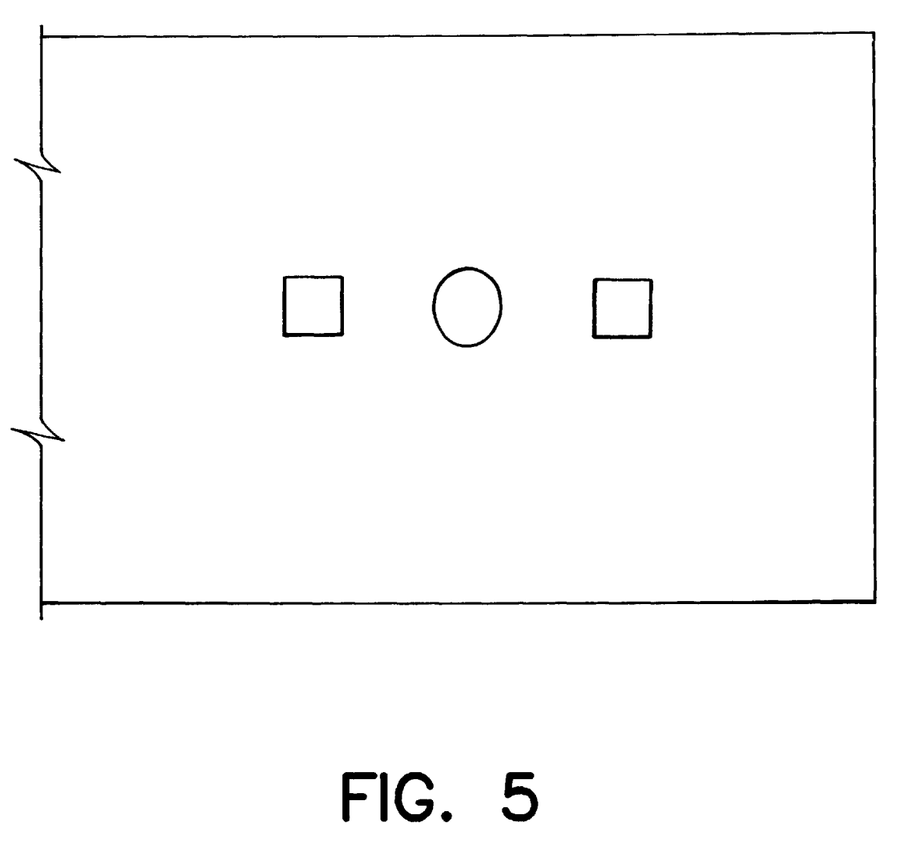
FIG. 5 illustrates working integrated orange, green and blue devices with the structure according to FIG. 1C.

A photograph of the integrated polymer-based orange, green and blue devices at work is shown in FIG. 5. The devices are integrated with scheme III shown in FIG. 1C. The devices used in this embodiment are made from molecularly doped polymers (MDP), in which the hole-transporting matrix polymer poly(N-vinylcarbazole)(PVK) is doped with electron-transporting molecules, such as tris (8-hydroxy quinolate)aluminum (Alq) or 2-(4-biphenyl)-5-(4-tert-butyl-phenyl)-1,3,4-oxadiazole (PBD) and different fluorescent dyes as efficient emission centers. This class of devices has the advantage that all carrier transport and emissive materials are mixed together in a solution and can be deposited by a single coating step, without the need to address the solvent compatibility of separate carrier transport and emissive layers, thereby simplifying fabrication. In addition, the emission color can easily be tuned by doping with different dyes, and the optical and electrical properties can usually be optimized by tailoring the ratios of different components in MDP. The orange, green and blue MDPs used for this embodiment of the invention are composed of (for example) PVK/Alq/nile red, PVK/Alq/coumarin 6, and PVK/PBD/coumarin 47, respectively. Techniques for mixing molecular dyes with hole and electron transport materials in a single blend are described. Red emission instead of orange emission can be achieved by increasing the nile red fraction, but with loss of efficiency.

Figure 7A:
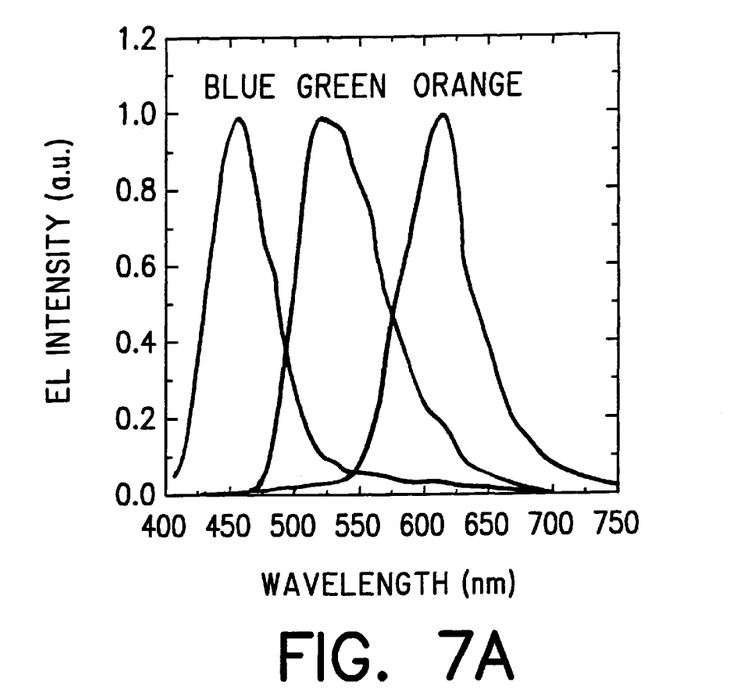
FIG. 7A illustrates EL spectra of the orange, green and blue LEDs.
Figure 7B:
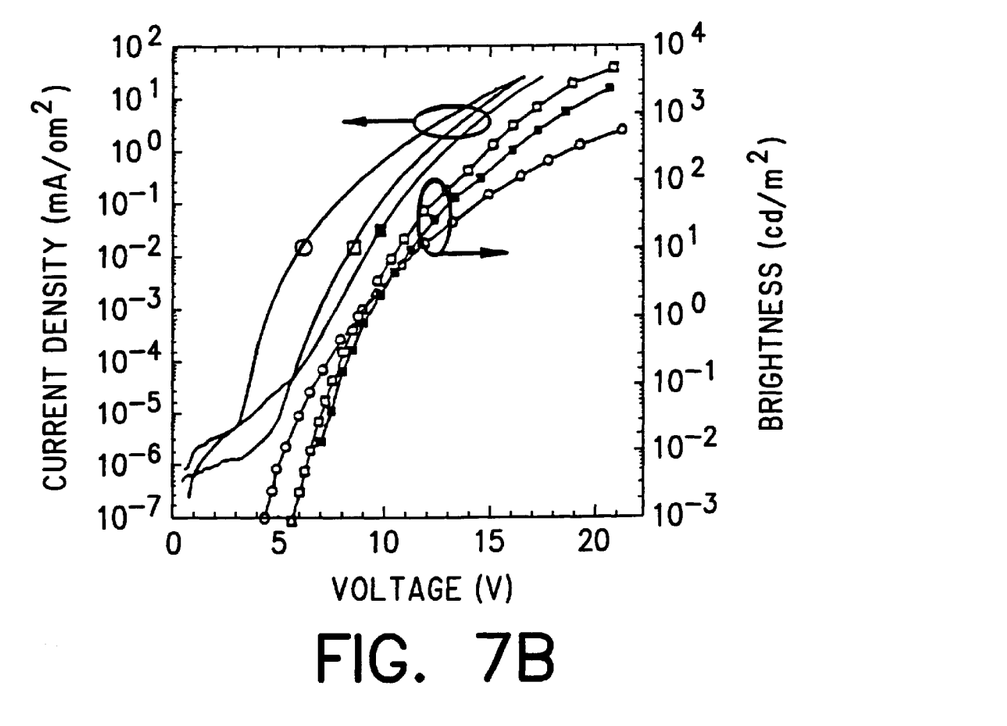
FIG. 7B illustrates the forward current-voltage and brightness-voltage characteristics of the orange, green and blue devices.

The electroluminescence spectra of the three devices are shown in FIG. 7A. Typical I–V characteristics are shown in FIG. 7B, along with the brightness versus voltage curve (L-V). The external quantum efficiencies, measuring only light through the back the glass substrate, were 0.7%, 0.5%, and 0.4% photon/electron for orange, green and blue, respectively. Practical brightness can be obtained at reasonable operating voltages, for example, video brightness of approximately 100 cd/m$^2$, at 11–13 V and high brightness of approximately 4000 cd/m$^2$, at around 20 V.

Figure 6:
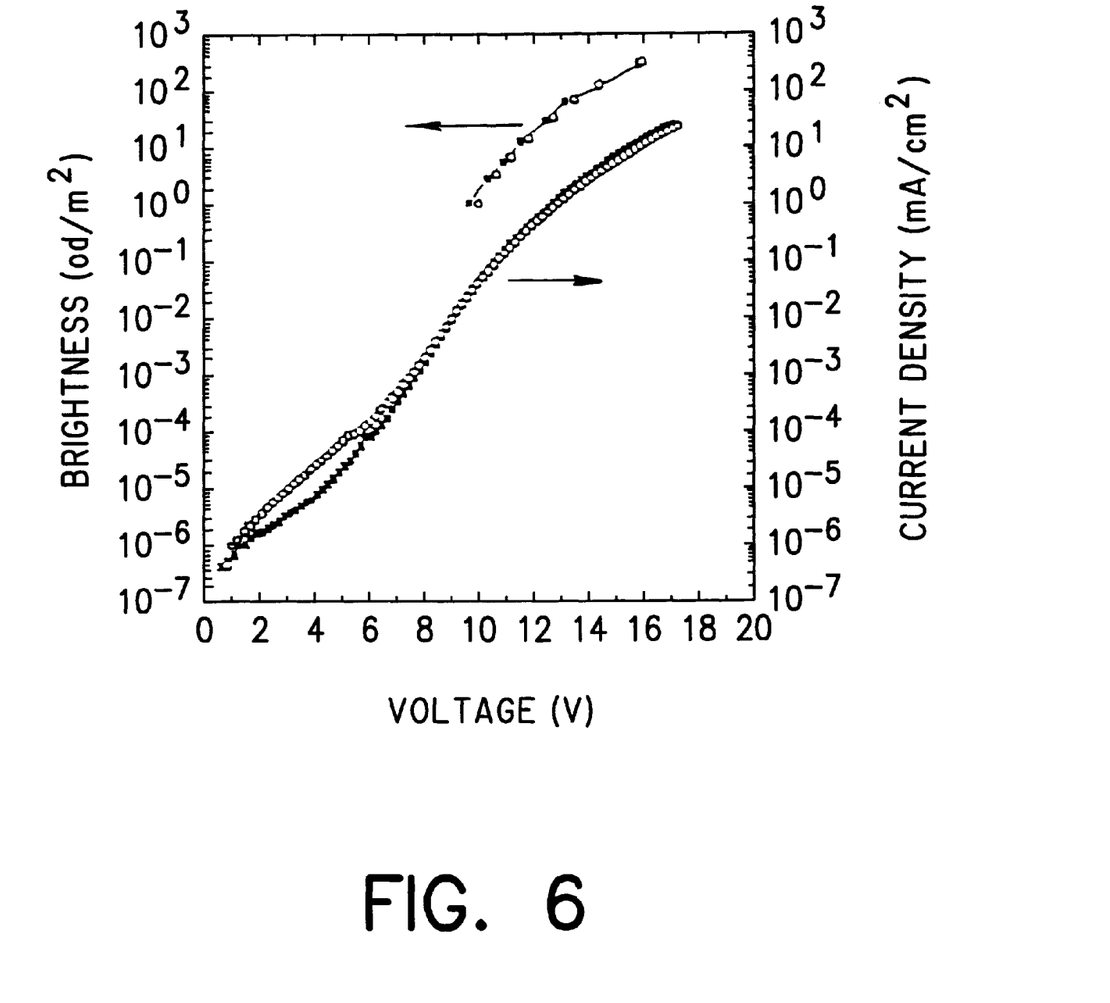
FIG. 6 is a plot of brightness vs. voltage, and current vs. voltage for device performance with and without use of an integration process of the present invention.

The effect of integration processing on devices was checked by comparing the characteristics of devices when they were just freshly made to those of the same devices after they underwent all integration processing. FIG. 6 compares the brightness vs. voltage (L-V) and current vs. voltage (I-V) characteristics of an orange device in the structure of FIG. 1B before (solid square) and after (open circle) the integration processing. This orange device was the first device put down on the substrate and underwent two plasma etching steps and two spin coating steps for the integration of the following green and blue devices. The device characteristics are virtually unchanged after integration processing, as seen in FIG. 6, and are virtually identical to those of discrete devices shown in FIG. 7. The plasma etching step was found to be especially benign. Devices subjected to plasma etching without the patterned insulator as shown in FIG. 1A also exhibited no visible change compared to their operation before the organic material was patterned.

But, of course, the approaches described in the present invention, can be applied to any kind of polymer or molecular LEDs, each consisting of either a single organic layer or heterostructure multilayers. The fabrication processing described in this invention can overcome the processing sensitivities of organic-based devices and allows the integration of individually optimized organic LEDs for a multi-color organic display and will give better performances, such as higher luminous efficiency and better contrast than the other schemes for multi-color organic displays. For example, a multi-color display can be realized by an organic white emitter with patterned color filters. Another example is the use of blue emitters with patterned color-conversion phosphors. It is apparent that the filters block at least two thirds of the light, leading to a lower luminous efficiency. The use of efficient color-conversion phosphors will cause the image contrast problem by the environment background light.

In view of the above, it can be seen that the display devices of the present invention are appropriate for an extremely wide variety of applications including billboards and signs, computer monitors, telecommunications devices such as telephones, televisions, large area wall screens, theater screens and stadium screens.

Those of skill in the art may recognize certain modifications to the various embodiments of the invention, which modifications are meant to be covered by the spirit and scope of the appended claims.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", having Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 14, 1997); "Light Emitting Devices Having High Brightness", Ser. No. 08/844,353 (filed Apr. 18, 1997); "Organic Semiconductor Laser", U.S. Ser. No. 08/859,468; (filed May 19, 1997); "Saturated Full Color Stacked Organic Light Emitting Devices", U.S. Ser. No. 08/858,994 (filed May 20, 1997); and "An Organic Light Emitting Device Containing a Hole Injection Enhancement Layer", U.S. Ser. No. 08/865,491 (filed May 29, 1997); "Plasma Treatment of Conductive Layers," PCT/US97/10252 (filed herewith), each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

What is claimed is:

1. An organic light emitting device comprising:
    a substrate;
    a patterned first electrical contact layer over said substrate;
    a patterned organic layer over said first contact layer, wherein said patterned organic layer covers sides of said first electrical contact layer;
    a second electrical contact layer over said organic layer; and
    a covering portion covering sides of said organic layer, wherein said covering portion includes a conductive layer extending from said substrate to said second electrical contact layer.

2. A method of forming an organic light emitting device comprising:
    providing a first electrical contact layer;
    providing a first organic layer over said first electrical contact layer;
    providing a patterned second electrical contact layer over said first organic layer; and
    etching said first organic layer using said patterned second electrical contact layer as a mask.

3. The method of claim 2, wherein said step of etching exposes an area over said first electrical contact layer.

4. A method of forming an organic light emitting device, comprising:
    providing a first electrical contact layer;
    providing a first organic layer over said first electrical contact layer;
    providing a patterned second electrical contact layer over said first organic layer;
    etching said first organic layer using said patterned second electrical contact layer as a mask, wherein said step of etching exposes an area over said first electrical contact layer; and
    providing a second organic layer over said exposed area over said first electrical contact layer.

5. A method of forming an organic light emitting device, comprising:
    providing a first electrical contact layer;
    providing a first organic layer over said first electrical contact layer;
    providing a patterned second electrical contact layer over said first organic layer; and
    etching said first organic layer using said patterned second electrical contact layer as a mask;
    wherein said first electrical contact layer is patterned before providing said first organic layer.

6. A method of forming an organic light emitting device, comprising:
    providing a first electrical contact layer;
    providing a first organic layer over said first electrical contact layer;
    providing a patterned second electrical contact layer over said first organic layer; and
    etching said first organic layer using said patterned second electrical contact layer as a mask;
    wherein said first organic layer is provided by spin coating.

7. A method of forming an organic light emitting device, comprising:
    providing a first electrical contact layer;
    providing a first organic layer over said first electrical contact layer;
    providing a patterned second electrical contact layer over said first organic layer; and
    etching said first organic layer using said patterned second electrical contact layer as a mask;
    wherein said first organic layer is provided by vacuum deposition.

8. A method of forming an organic light emitting device, comprising:
    providing a first electrical contact layer;
    providing a first organic layer over said first electrical contact layer;
    providing a patterned second electrical contact layer over said first organic layer; and
    etching said first organic layer using said patterned second electrical contact layer as a mask;
    wherein said first electrical contact layer is a patterned layer made using a shadow mask technique.

9. A method of forming an organic light emitting device, comprising:
providing a first electrical contact layer;
providing a first organic layer over said first electrical contact layer;
providing a patterned second electrical contact layer over said first organic layer; and
etching said first organic layer using said patterned second electrical contact layer as a mask;
wherein said first electrical contact layer is a patterned layer made using a lithographic technique.

10. The method of claim 4 further comprising:
providing a patterned third electrical contact layer over said second organic layer; and
etching said second organic layer using said patterned third electrical contact layer as a mask.

11. A method of forming an organic light emitting device comprising:
providing a first electrical contact layer;
providing a first organic layer over said first electrical contact layer;
providing a patterned second electrical contact layer over said first organic layer; and
etching said first organic layer using as a mask a layer on top of said patterned second electrical contact layer which has the same pattern as said patterned second electrical contact layer.

12. The method of claim 11, wherein said step of etching exposes an area over said first electrical contact layer.

13. The method of claim 12, further comprising providing a second organic layer over said exposed area over said first electrical contact layer.

14. The method of claim 11, wherein said first electrical contact layer is patterned before providing said first organic layer.

15. The method of claim 11, wherein said first organic layer is provided by spin coating.

16. The method of claim 11, wherein said first organic layer is provided by vacuum deposition.

17. The method of claim 11, wherein said first electrical contact layer is a patterned layer made using a shadow mask technique.

18. The method of claim 11, wherein said first electrical contact layer is patterned layer made using a lithographic technique.

19. The method of claim 13 further comprising:
providing a patterned third electrical contact layer over said second organic layer; and
etching said second organic layer using as a mask a layer on top of said patterned third electrical contact layer which has the same pattern as said patterned third electrical contact layer.

20. A method of forming a plurality of organic light emitting devices, comprising the steps of:
(a) fabricating a first organic light emitting device having a first organic layer;
(b) fabricating a protective covering layer that protects the first organic layer;
(c) fabricating a second organic light emitting device having a second organic layer, such that the second organic layer is deposited after the protective covering layer is fabricated.

21. The method of claim 20, wherein the step of fabricating the second organic light emitting device includes an etching process.

22. The method of claim 20, wherein the step of fabricating the second organic light emitting device includes a spin coating process.

23. The method of claim 20, wherein the step of fabricating the second organic light emitting device includes the use of processing liquids.

24. The method of claim 20, wherein the step of fabricating the first organic light emitting device includes etching the first organic layer using an electrical contact layer of the first organic light emitting device as a mask.

25. A method of forming a plurality of organic light emitting devices, comprising the steps of:
(a) fabricating a first organic light emitting device having a first organic layer;
(b) fabricating a first protective covering layer that protects the first organic layer;
(c) fabricating a second organic light emitting device having a second organic layer, such that the second organic layer is deposited after the first protective covering layer is fabricated;
(d) fabricating a second protective covering layer that protects the second organic layer;
(e) fabricating a third organic light emitting device having a third organic layer, such that the third organic layer is deposited after the second protective covering layer is fabricated.

26. The method of claim 25, wherein each of the first, second, and third organic light emitting devices emits a different color of light.

27. The method of claim 26, wherein each of the first, second, and third organic light emitting devices emits a different color of light selected from the group consisting of orange, green and blue.

28. The method of claim 26, wherein each of the first, second, and third organic light emitting devices emits a different color of light selected from the group consisting of red, green and blue.

* * * * *

UNITED STATES PATENT AND TRADEMARK OFFICE
CERTIFICATE OF CORRECTION

PATENT NO. : 6,566,156 B1
DATED : May 20, 2003
INVENTOR(S) : Sturm et al.

It is certified that error appears in the above-identified patent and that said Letters Patent is hereby corrected as shown below:

Column 7,
Line 33, change "SiN," to -- $SiN_x$ --; and
Line 49, change "SiN" to -- $SiN_x$ --.

Signed and Sealed this

Twentieth Day of January, 2004

JON W. DUDAS
*Acting Director of the United States Patent and Trademark Office*